United States Patent [19]

Furukawa

[11] Patent Number: 4,706,265
[45] Date of Patent: Nov. 10, 1987

[54] CODE CONVERTING SYSTEM AND METHOD FOR BAND COMPRESSION OF DIGITAL SIGNALS

[75] Inventor: Akihiro Furukawa, Tokyo, Japan

[73] Assignee: NEC Corporation, Japan

[21] Appl. No.: 792,760

[22] Filed: Oct. 30, 1985

[30] Foreign Application Priority Data

Oct. 30, 1984 [JP] Japan ................................ 59-228631

[51] Int. Cl.$^4$ ............................................. H04N 7/12
[52] U.S. Cl. ............................ 375/122; 340/347 DD; 358/133; 358/261
[58] Field of Search ................. 375/122; 358/133, 136, 358/138, 260, 261; 340/347 DD; 360/40; 381/34

[56] References Cited

U.S. PATENT DOCUMENTS 3,984,833 10/1976 Voorhis ....................... 340/347 DD
4,218,704 8/1980 Netravali et al. ..................... 375/28
4,534,055 8/1985 Iinuma ................................... 381/34
4,569,058 2/1986 Grallert .............................. 358/133

Primary Examiner—Benedict V. Safourek
Attorney, Agent, or Firm—Ostrolenk, Faber, Gerb & Soffen

[57] ABSTRACT

A code converting system for converting a digital signal having a given number of bits into a digital signal having a different number of bits, which selectively alters the encoding method depending on the nature of the input to the system. The system includes a variable length encoder; a run-length encoder; a multiplexer for selecting as its output either the variable length code or the run-length code; a buffer memory for receiving and storing the output of the multiplexer, supplying it to a transmission line, and generating a signal indicative of the level of memory occupancy of the buffer memory; and control means for controlling the multiplexer so as to output only variable length code when the memory occupancy is below a first predetermined level. The control means further comprises an underflow signal generator for generating a signal indicative of when the memory occupancy is less than the first predetermined level. The underflow signal is supplied to a gate, which transfers it as a selection signal to control the multiplexer so as to output only said variable length code when such underflow occurs. In the absence of an underflow indication signal, the gate is enabled to pass the input code, to the run-length encoder to be converted into a run-length code. The control means is also adjustable so as to control the level of memory occupancy of the buffer memory.

20 Claims, 6 Drawing Figures

FIG.2A.

| LEVEL NUMBER | CODE LENGTH | V CODE |
|---|---|---|
| 0 | 4 | $V_0$ 0111 |
| 1 | 2 | $V_1$ 1S |
| 2 | 5 | $V_2$ 0110S |
| 3 | 7 | $V_3$ 010111S |
| 4 | 7 | $V_4$ 010110S |
| 5 | 8 | $V_5$ 0101011S |
| ------ | ------ | ------ |

FIG.2B.

| RL | CODE LENGTH | RL CODE |
|---|---|---|
| 2 | 5 | 00001 |
| 3 | 5 | 00000 |
| 4 | 6 | 001010 |
| 5 | 6 | 001001 |
| 6 | 6 | 001000 |
| 7 | 7 | 0010111 |

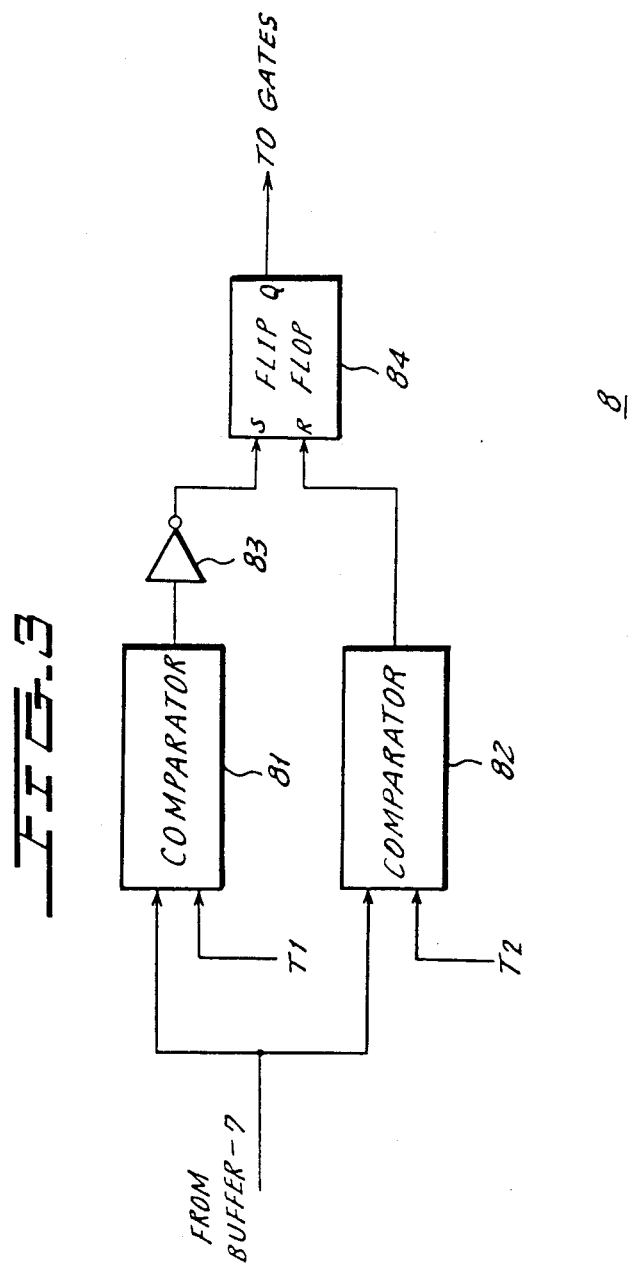

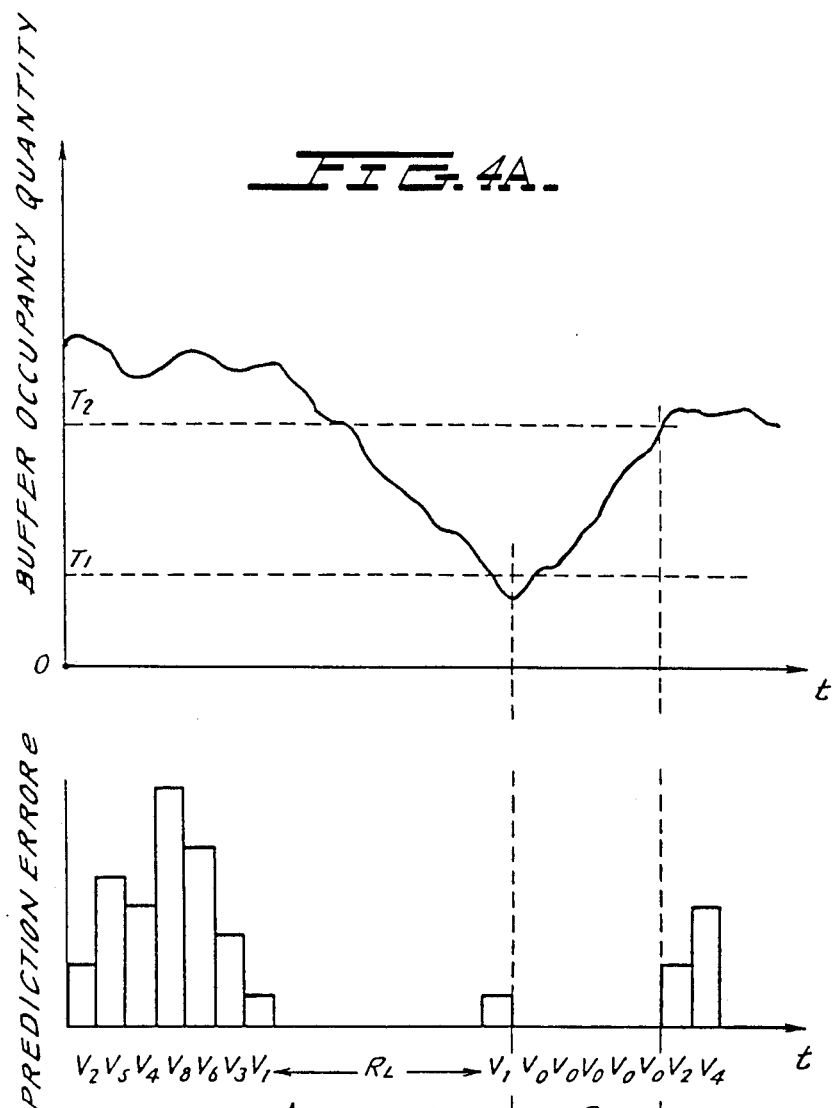

CODE CONVERTING SYSTEM AND METHOD FOR BAND COMPRESSION OF DIGITAL SIGNALS

BACKGROUND OF THE INVENTION

The present invention relates to a code converting system for converting a digital signal consisting of a given number of bits into one consisting of a different number of bits, and more particularly to a code converting system suited to encoders for bandwidth compression of television signals or the like.

One known system for efficiently encoding multi-level signals including television signals is the predictive encoding system disclosed in U.S. Pat. No. 4,133,006. This encoding system is disclosed to include a code converting system for further efficient encoding of prediction error signals. One such prior art code converting system comprises, as described in U.S. Pat. No. 4,534,055 a run-length encoder for run-length encoding of the level having the highest frequency of occurrence (level 0 for instance) in the prediction error signals, and a variable length encoder for variable length encoding of all other levels. This prior art converter however, has the disadvantage that, during a period when the highest occurrence frequency level is generated continuously, the quantity of information generated becomes too small, resulting in underflow of the buffer memory used in the predictive encoder.

To avoid such underflow, in the prior art, compression encoding, such as predictive encoding, is suspended when the contents or occupancy of the buffer memory falls below a certain level, whereupon input signals are transmitted intact as pulse code modulated (PCM) signals. This method, however, has the following three disadvantages:

(a) Because of the great increase in the quantity of information that is generated when compression is suspended and PCM transmission is begun, the occupancy of the buffer memory will sharply increase. As a result, a rough encoding mode must be employed to avoid overflow of the buffer memory, and this invites a deterioration of the picture quality of decoded signals.

(b) The hardware structure is complicated by the need for controls for altering the encoding method.

(c) The alteration of the encoding method cannot be finely controlled.

SUMMARY OF THE INVENTION

An object of the present invention is to provide a code converting system that is free of the disadvantages stated above and is capable of preventing underflow by finely controlling the occupancy of the buffer memory.

A converter according to the invention has first code converting means for converting a first code resulting from the encoding of multi-level signals in a prescribed manner into a variable length code, and second code converting means for converting the first code into a run-length code. A selector selects either the variable length code or the run-length code in response to a selection signal, and supplies the selected code to a memory. The memory stores the output of the selector, supplies it to a transmission line at a constant speed, and at the same time generates a signal that is representative of the memory occupancy by counting the quantity of code data stored therein. A control circuit controls the selector so as to output the variable length code when the memory occupancy is below a prescribed level.

The above and other objects, features and advantages of the present invention will become apparent from the following detailed description of one preferred embodiment thereof, taken in conjunction with the accompanying drawings.

BRIEF DESCRIPTION OF THE DRAWINGS

FIGS. 2A and 2B are tables showing examples of variable length codes and run length codes for use in the embodiment illustrated in FIG. 1;

FIG. 3 is a circuit diagram illustrating an example of a controller used in FIG. 1; and FIGS. 4A and 4B are diagrams for describing the operation of the converter according to the embodiment.

DESCRIPTION OF THE PREFERRED EMBODIMENT

Figure 1:
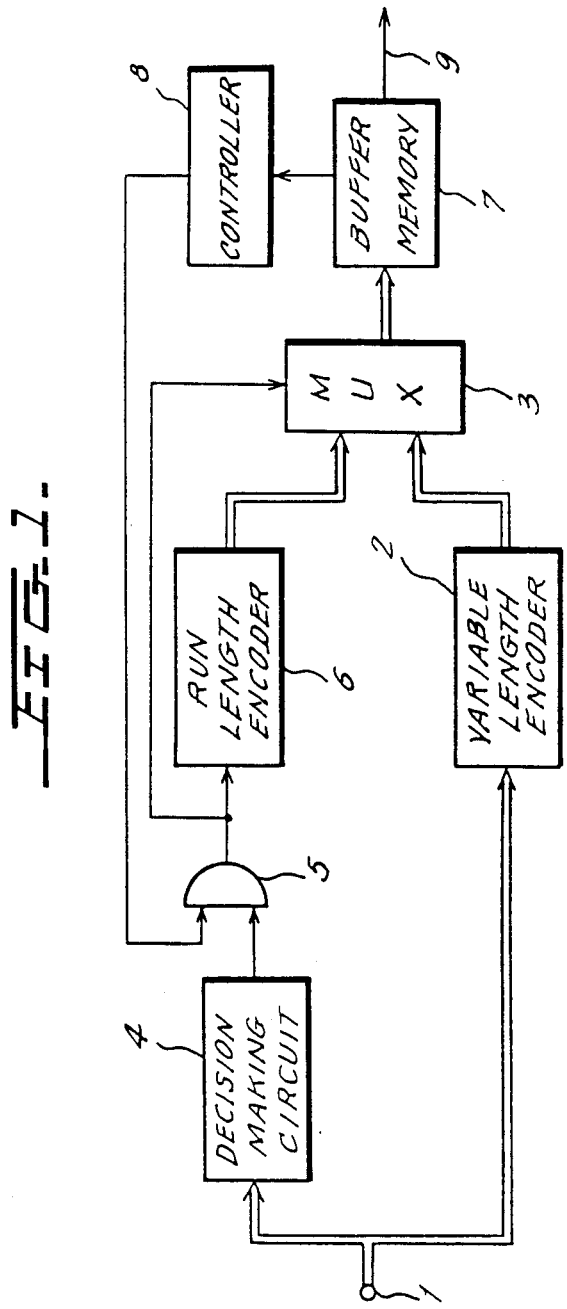
FIG. 1 is a block diagram illustrating one preferred embodiment of the invention.

Referring to FIG. 1, an input terminal 1 receives, for example, a prediction error signal e resulting from predictive encoding of a television signal. The prediction error signal corresponds, for instance, to the output of the quantizer 13 shown in FIG. 1 of U.S. Pat. No. 4,133,066. A variable length encoder 2 converts the prediction error signal e into a variable length code, and supplies it to a selector such as a multiplexer 3.

FIG. 2A shows examples of variable length codes. In FIG. 2A, level numbers 0, 1, 2, . . . correspond, for instance, to signal levels 0, 1, 2, . . . , and the V code heading collectively refers to variable length codes V0, V1, V2, . . . The letter S in a V code represents a polarity bit showing whether the code is positive or negative. Referring again to FIG. 1, a decision making circuit 4 decides whether or not a given prediction error signal is zero, and supplies the decision to an AND gate circuit 5. Herein, when the prediction error signal is zero, "1" is supplied. The gate circuit 5, in response to a value "1" of an underflow signal supplied at its other input by a controller 8, to be described below, feeds the output of the decision making circuit 4 to a run-length encoder 6. The gate circuit 5 also supplies its output as a control signal to the multiplexer 3. The run-length encoder 6 run-length-encodes the output of the decision making circuit 4 according to the table shown in FIG. 2B, and supplies its encoded circuit output to the multiplexer 3. In FIG. 2B, RL represents the run length showing how many bits of the input signal to the run-length encoder 6 stay at a level "1".

The multiplexer 3, in response to the control signal from the gate circuit 5, supplies the output of either the run-length encoder 6 or the variable length encoder 2 of a buffer memory 7. The output of the encoder 6 in this embodiment is selected in response to a control signal "1", and the encoder 2 is selected in response to "0". The buffer memory 7, after temporarily storing the encoded outputs of the encoders 6 and 2, outputs them to a transmission line 9 at a constant speed.

The buffer memory 7 determines the occupancy level on the basis of the difference between the write address and the read address, and feeds it to the controller 8. For details of a buffer memory that may be used herein, reference may be made to FIGS. 1 and 2 of U.S. Pat. No. 4,215,369. The controller 8, when the buffer occupancy is smaller than a first value T1, supplies an underflow indication signal "0" representing an underflow of the buffer memory 7, to the gate circuit 5. This underflow signal continues to be supplied until the occupancy again rises to a second value T2 (T1<T2). In this embodiment, the variable length encoder 2 includes a read only memory (ROM) for storing the table of FIG. 2A, and the decision making circuit 4 includes a comparator circuit.

Referring now to FIG. 3, the controller 8 comprises a comparator 81 for comprising the first value T1 and the occupancy of the buffer memory 7, an inverter 83 for inverting the output of the comparator 81, another comparator 82 for comparing the occupancy and the second value T2, and a flipflop 84 responding to the outputs of these two comparators 81 and 82. In this structure, when the occupancy is smaller than T1, the flipflop 84 is set, and produces "1" at its Q-terminal. In this state, when the occupancy returns to the value T1 and then further increases between T1 and T2, the flipflop 84 continues to produce "1". When the occupancy further increases beyond T2, the comparator 82 resets the flipflop 84, which then produces "0".

FIGS. 4A and 4B are diagrams for describing the control of the buffer occupancy. In these figures, V2, V5, V4, and so forth, represent variable length codes and RL represents the run-length code, in FIGS. 2A and 2B, respectively. In normal operation, when the controller 8 produces an underflow indication signal "1" showing that the buffer memory 7 is not in an underflow condition, the signal "1" takes control of the gate 5 which is enabled to respond to the output of the decision making circuit 4. Therefore, the gate 5 supplies the output from the decision making circuit 4 to the multiplexer 3 which selects either non-zero variable length codes V2, V5, V4, etc., . . . or the run length code, depending upon whether the prediction error signal is zero or not, as in section A of FIG. 4B.

However, when underflow of the buffer memory 7 is detected, the controller 8 supplies the underflow indication signal "0" to the gate 5. The gate 5 is thereby disabled and provides a control signal "0" to the multiplexer 3, which selects the output of the variable length encoder 2, such as variable length codes V1, V0, V0, etc., . . . as shown in section B, despite the detection of the level zero signal in the decision making circuit 4 and the output level therefrom of "1". As long as only variable length codes are selected, even if the zero e signal level continuously appears, the occupancy level of the buffer memory 7 will increase, as shown in FIG. 4A. After that, when the buffer occupancy reaches the prescribed level T2, either a run-length code or a variable length code is selected again as in section A.

As hitherto described, the present invention makes it possible to realize a system free of picture quality deterioration, as it enables the quantity of encoded information stored in the buffer memory to be gradually increased by selectively variable length-encoding all the input signals in response to an underflow indication signal from the controller. The invention further makes it possible to set the length of section B as desired by appropriately setting the two thresholds T1 and T2, and thereby controlling control the buffer memory occupancy more finely.

What is claimed is:

1. A code converting system comprising
   first code converting means for converting a first code into a variable length code,
   second code converting means for converting such first code into a run-length code,
   selector means for receiving said variable length code and said run-length code and selecting one of said variable length code and said run-length code as its output,
   memory means for receiving and storing the output of said selector means, supplying it to a transmission line, and generating a signal indicating the memory occupancy of said memory means, and
   control means for controlling said selector means to output said variable length code when said memory occupancy is below a first predetermined level.

2. A system as in claim 1, wherein said memory means supplies said output of said selector means to said transmission line at a constant rate.

3. A system as in claim 1, wherein said first and second code converting means are adapted for converting a first code which is derived from an encoding of multilevel signals.

4. A code converting system comprising
   first code converting means for converting a first code into a variable length code,
   second code converting means for converting such first code into a run-length code,
   selector means for receiving said variable length code and said run-length code and selecting one of said variable length code and said run-length code as its output,
   memory means for receiving and storing the output of said selector means, supplying it to a transmission line, and generating a signal indicating the memory occupancy of said memory means, and
   control means for controlling said selector means to output said variable length code when said memory occupancy is below a first predetermined level; wherein said control means comprises
   detector means for indicating whether said first code is a first digital value,
   underflow signal generator means for generating an underflow indication signal when said memory occupancy is less than said first predetermined level, and
   a gate circuit for receiving said underflow indication signal and the output of said detector means and in response thereto generating a selection signal for controlling said selector means.

5. A system as in claim 4, wherein said output of said gate circuit is received by said second code converting means for being converted into a run-length code.

6. A system as in claim 4, wherein said gate circuit is a two-input AND gate,
   said detector means generating an output of a second digital value to indicate when said first code is said first digital value, and
   said underflow indication signal being said first digital value to indicate when said memory occupancy is less than said first predetermined level.

7. A system as in claim 6, wherein said underflow indication signal, after having been said first digital value, does not change until said memory occupancy rises to greater than said first predetermined level.

8. A system as in claim 7, wherein said underflow indication signal does not change from said first digital value until said memory occupancy rises to a second predetermined level which is greater than said first predetermined level.

9. A system as in claim 8, wherein said two predetermined levels are adjustable for adjusting said memory occupancy.

10. A system as in claim 9, wherein the difference between said two predetermined levels is adjustable for adjusting said memory occupancy.

11. A code converting method comprising the steps of
converting a first code into a variable length code,
converting said first code into a run-length code,
selecting a selected code, which is either said variable length code or said run-length code, in response to a selection signal,
storing said selected code in a memory,
supplying said selected code from said memory to a transmission line,
generating said selection signal to be indicative of the memory occupancy of said memory by detecting the quantity of code stored in said memory, and
selecting said variable length code as said selected code when said memory occupancy is below a first predetermined level.

12. A method as in claim 11, including supplying said selected code to said transmission line at a constant rate.

13. A method as in claim 11, wherein said first code is derived from an encoding of multi-level signals.

14. A code converting system comprising
first code converting means for converting a first code into a variable length code,
second code converting means for converting such first code into a run-length code,
selector means for receiving said variable length code and said run-length code and selecting one of said variable length code and said run-length code as its output,
memory means for receiving and storing the output of said selector means, supplying it to a transmission line, and generating a signal indicating the memory occupancy of said memory means, and
control means for controlling said selector means to output said variable length code when said memory occupancy is below a first predetermined level; wherein said control means comprises:
underflow signal generator means for generating an underflow indication signal indicative of whether said memory occupancy is less than said first predetermined level,
detector means for generating an output indicative of whether such first code is a first digital value, and
gate means for transferring said underflow indication signal as a selection signal to said selector means when such underflow occurs,
said gate means also receiving and transferring said output of said detector means to said second code converting means in the absence of said underflow indication signal for being converted into a run-length code.

15. A code converting method comprising the steps of
converting a first code into a variable length code,
converting said first code into a run-length code,
selecting a selected code, which is either said variable length code or said run-length code, in response to a selection signal,
storing said selected code in a memory,
supplying said selected code from said memory to a transmission line,
generating said selection signal to be indicative of the memory occupancy of said memory by detecting the quantity of code stored in said memory, and
selecting said variable length code as said selected code when said memory occupancy is below a first predetermined level; wherein said selection signal is generated by
generating an underflow indication signal which indicates whether said memory occupancy is less than said first predetermined level;
generating a detection signal which indicates whether said first code is a first digital value;
gating said underflow indication signal as said selection signal when memory occupancy that is less than said first predetermined level is indicated and when said first code is said first digital value.

16. A method as in claim 15, including converting said detection signal into said run-length code, when memory occupancy is not indicated to be less than said first predetermined level.

17. A method as in claim 15, wherein said underflow indication signal is set to said first digital value to indicate memory occupancy less than said first predetermined level; and said underflow indication signal, after having been set to said first value, does not change until said memory occupancy rises to greater than said first predetermined level.

18. A method as in claim 17, wherein said underflow indication signal does not change from said first digital value until said memory occupancy rises to a second predetermined level which is greater than said first predetermined level.

19. A method as in claim 18, including adjusting said two predetermined levels to adjust said memory occupancy.

20. A method as in claim 19, including adjusting the difference between said two predetermined levels to adjust said memory occupancy.

* * * * *